(12) United States Patent
Tan et al.

(10) Patent No.: US 9,332,659 B2
(45) Date of Patent: May 3, 2016

(54) ELECTRONIC COMPONENT CASE AND ELECTRONIC COMPONENT DEVICE

(71) Applicant: Shinko Electric Industries Co., Ltd., Nagano-shi (JP)

(72) Inventors: Minshong Tan, Nagano (JP); Syuzo Aoki, Nagano (JP); Takuya Oda, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 0 days.

(21) Appl. No.: 14/477,156

(22) Filed: Sep. 4, 2014

(65) Prior Publication Data

US 2015/0092337 A1    Apr. 2, 2015

(30) Foreign Application Priority Data

Sep. 27, 2013    (JP) .................................. 2013-201828

(51) Int. Cl.
*H05K 5/00*    (2006.01)

(52) U.S. Cl.
CPC .................................... *H05K 5/0008* (2013.01)

(58) Field of Classification Search
CPC .. H05K 5/0008; H05K 5/0013; H05K 5/0221
USPC ..................... 361/679.58, 752, 759
See application file for complete search history.

(56) References Cited

U.S. PATENT DOCUMENTS

| | | | | | |
|---|---|---|---|---|---|
| 4,346,952 | A | * | 8/1982 | Bright .................. | H05K 7/1069 439/70 |
| 5,066,235 | A | * | 11/1991 | Kobayashi .......... | H04M 1/0249 439/76.1 |
| 5,353,201 | A | * | 10/1994 | Maeda .................. | H05K 9/0033 174/362 |
| 5,383,098 | A | * | 1/1995 | Ma ........................ | H04B 1/3833 174/371 |
| 5,675,300 | A | * | 10/1997 | Romerein .......... | H01R 13/6658 333/100 |
| 5,848,718 | A | * | 12/1998 | Colwell ................ | H02G 3/081 220/3.94 |
| 6,024,426 | A | * | 2/2000 | Korinsky ................ | G06F 1/181 312/223.2 |
| 6,111,760 | A | * | 8/2000 | Nixon .................. | H04B 1/3833 220/4.02 |
| 6,711,859 | B2 | * | 3/2004 | Bell ........................ | B65D 11/00 220/4.02 |
| 6,798,652 | B2 | * | 9/2004 | Wang ...................... | G06F 1/187 312/223.1 |
| 6,894,739 | B2 | * | 5/2005 | Sung ................. | G02F 1/133308 349/58 |
| 6,909,047 | B2 | * | 6/2005 | Zhang .................. | G11B 33/124 174/50 |
| 7,179,991 | B2 | * | 2/2007 | Chen ........................ | H05K 5/04 174/50 |

(Continued)

FOREIGN PATENT DOCUMENTS

| | | |
|---|---|---|
| JP | 2001-321838 A1 | 11/2001 |
| JP | 2010-258042 A1 | 11/2010 |

*Primary Examiner* — Adrian S Wilson
(74) *Attorney, Agent, or Firm* — Kratz, Quintos & Hanson, LLP

(57) ABSTRACT

An electronic component case includes a lower case including a bottom plate, a aide wall having a protruding portion, an engaging projection formed on an outer face of the side wall, and a screw hole formed in the side wall in a region where the protruding portion is provided, and an upper case including a top plate, a side wall in which an engaging hole is formed, and a notched hole forced in the side wall on the top plate side. The protruding portion of the lower case is engaged to the notched hole of the upper case, and the screw hole is exposed in the notched hole. The engaging projection of the lower case is engaged in the engaging hole of the upper case.

5 Claims, 11 Drawing Sheets

(56) References Cited

U.S. PATENT DOCUMENTS

| | | | |
|---|---|---|---|
| 7,209,195 B2 * | 4/2007 | Lin | G02F 1/133308 349/58 |
| 7,242,552 B2 * | 7/2007 | Kudo | G11B 33/08 360/97.12 |
| 8,213,182 B2 | 7/2012 | Aoki | |
| 8,434,798 B2 * | 5/2013 | Hsiung | H05K 5/0008 292/1 |
| 8,480,186 B2 * | 7/2013 | Wang | H05K 5/0013 312/223.1 |
| 2008/0123271 A1 * | 5/2008 | Shu | H05K 5/02 361/679.01 |
| 2008/0165485 A1 * | 7/2008 | Zadesky | H04M 1/0252 361/679.02 |
| 2008/0204987 A1 * | 8/2008 | Sakata | H05K 5/02 361/679.01 |
| 2009/0175020 A1 * | 7/2009 | Zadesky | G06F 1/1626 361/818 |
| 2010/0061044 A1 * | 3/2010 | Zou | B32B 3/02 361/679.01 |
| 2010/0259873 A1 * | 10/2010 | Lee | H04M 1/0266 361/679.01 |
| 2012/0106035 A1 * | 5/2012 | Chen | E05C 19/06 361/679.01 |
| 2013/0234571 A1 * | 9/2013 | Cheng | G06F 1/181 312/223.2 |

* cited by examiner

ELECTRONIC COMPONENT CASE AND ELECTRONIC COMPONENT DEVICE

CROSS-REFERENCE TO RELATED APPLICATIONS

This application is based upon and claims the benefit of priority of the prior Japanese Patent Application No. 2013-201828, filed on Sep. 27, 2013, the entire contents of which are incorporated herein by reference.

FIELD

This invention is related to an electronic component case and an electronic component device.

BACKGROUND ART

In the prior art, there is an electronic component device in which an electronic component is housed inside an electronic component case that an upper case is fixed on a lower case. In such electronic component device, engaging projections are provided on the side wall of the lower case, and engaging holes are provided in the side wall of the upper case. Then, the engaging projections of the upper case are engaged to the engaging holes of the lower case, thereby the lower case and the upper case are fixed.

A related art is disclosed in Japanese Laid-open Patent Publication No. 2001-321838, Japanese Laid-open Patent Publication No. 2010-258042.

SUMMARY

As will be explained in the preliminary matter section below, in the case of the electronic component case of a type in which the lower case and the upper case are fixed by the screw clamp, the lower case is manufactured by a die casting method. Therefore, there are the problems that the cost rise is caused, and it is not possible to respond to the thinner body and the weight saving easily.

According to one aspect discussed herein, there is provided an electronic component case, including a lower case including a bottom plate, a side wall having a protruding portion, an engaging projection formed on an outer face of the side wall, and a screw hole formed in the side wall in a region where the protruding portion is provided, and an upper case including a top plate, a side wall in which an engaging hole is formed, and a notched hole formed in the side wall of the top plate side, wherein the protruding portion of the lower case is engaged to the notched hole of the upper case, and the screw hole is exposed in the notched hole, and the engaging projection of the lower case is engaged to the engaging hole of the upper case.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENT

Hereinbelow, an embodiment will, be explained with reference to the accompanying drawings.

Figure 1:
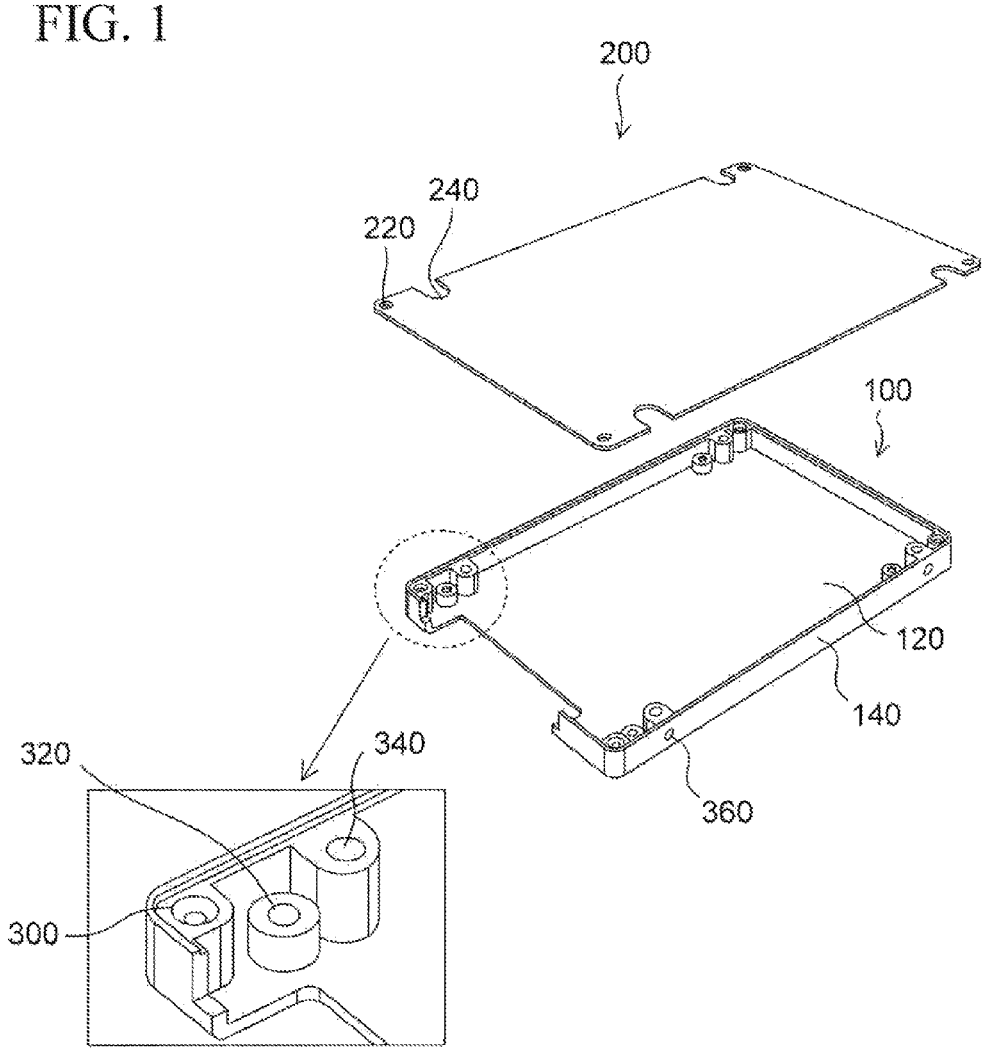
FIG. 1 is a perspective view depicting a lower case and an upper case of an electronic component device according to a preliminary matter.

Prior to the explanation of an embodiment, the preliminary matter to be set forth as a basis will be explained hereunder. As depicted in FIG. 1, an electronic component case according to the preliminary matter includes a lower case 100 and an upper case 200. The lower case 100 is formed of a bottom plate 120 and a side wall 140.

Referring to the partially enlarged perspective view in FIG. 1 additionally, a case fixing hole 300 for screwing the upper case 200, a substrate fixing screw hole 320 for screwing a substrate of an electronic component (not depicted) to be housed, and an upper-face fixing screw hole 340 for attaching the electronic component case to a housing of electronic equipment or the like, are arranged side by side at each of the four corners of the lower case 100.

Moreover, a side-face fixing screw hole 360 for attaching the electronic component case to the housing of the electronic equipment or the like is formed in the side wall 140 located to the vicinity part of each upper-face fixing screw hole 340.

On the other hand, the upper case 200 is formed in a flat plate shape, and an attaching hole 220 for screwing to the case fixing holes 300 of the lower case 100 is opened at each of the four corners of the upper case 200. Moreover, a notched opening portion 240 is formed in the upper case 200 at each of positions corresponding to the upper-face fixing screw holes 340 of the lower case 100.

Then, the substrate (not depicted) of the electronic component, is arranged, on the lower case 100, and the substrate of the electronic component is fixed to the substrate fixing screw holes 320 of the lower case 100 by screwing.

Figure 2:
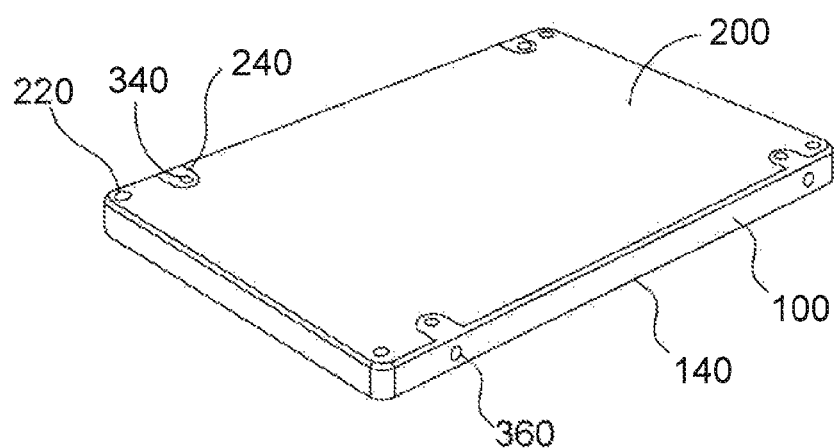
FIG. 2 is a perspective view depicting the electronic component device according to the preliminary matter.

Further, as depicted in FIG. 2, the upper case 200 is arranged on the lower case 100 on which the substrate of the electronic component is attached, and fixed by screwing to the case fixing holes 300 of the lower case 100 through the attaching holes 220 of the upper case 200. At this time, it is in a state that the upper-face fixing screw holes 340 of the lower case 100 are exposed from the notched opening portions 240 of the upper case 200.

Then, the electronic component case is fixed by screwing to the housing of the electronic equipment or the like by using the upper-face fixing screw holes 340 or the side-face fixing screw holes 360.

In the electronic component case according to the preliminary matter, the substrate of the electronic component and the upper case 200 are fixed to the lower case 100 by screwing. Therefore, a relatively thick part for arranging a screw hole is necessary at each of the four corners of the lower case 100.

For this reason, the lower case 100 is manufactured by the die casting method in many cases. In the die casting method, melted metal is poured into an accurate die while applying the pressure to the melted metal, thereby the metal is molded.

On the other hand, since the upper case 200 has a simple shape like a thin plate, the upper case 200 can be easily manufactured by stamping a metal plate.

In the die casting method as described above, a life of the die is shorter as compared with the method of stamping the metal plate. Therefore it. is necessary to renew the die in a certain period of time, thus there is a problem that the running cost increases. Moreover, the die casting method is a complicated manufacturing method and requires many steps and a long process time, and therefore the die casting method tends to become the disadvantageous when the mass production is performed. Furthermore, in the die casting method, dimensional accuracy is lower as compared with the method of stamping the metal plate, and therefore it is difficult to apply to the products in which high accuracy is required.

Also, in the die casting method, only the metal of its exclusive use can be used. Therefore the material of the lower case 100 manufactured by the die casting method is limited to aluminum alloys or the like which contain relatively large amounts of binder and impurities, thus the lower case 100 formed of such material does not have sufficient thermal conductivity.

As aluminum alloys for use in the die casting method, there are aluminum (M)-silicon (Si)-copper (Cu)-based alloys in which silicon (Si) is contained by the ratio of 9.6 to 12.0% and copper (Cu) is contained by the ratio of 1.5 to 3.5%.

For this reason, in the case that the electronic component case needs high heat radiation property, since the die casting method cannot use the metal material having excellent thermal conductivity, there is a problem that the die casting method cannot easily respond to it.

Further, in the die casting method, since it is necessary to polish the surface as the final finish, the unnecessary man hour is needed as compared with the stamping method. Furthermore, a metal body manufactured by the die casting method is difficult to blacken by a production of a hard anodized coating. For this reason, it is necessary to polish the surface and then perform surface painting or printing.

Also, since the electronic component case of the preliminary matter is fixed by screwing, a thick part of some extent is necessary in order to arrange the screw holes. For this reason, there is the problem that it cannot easily respond to further thinner body and weight saving.

An embodiment to be explained below can solve the above-described problems.

Embodiment

Figure 3A:
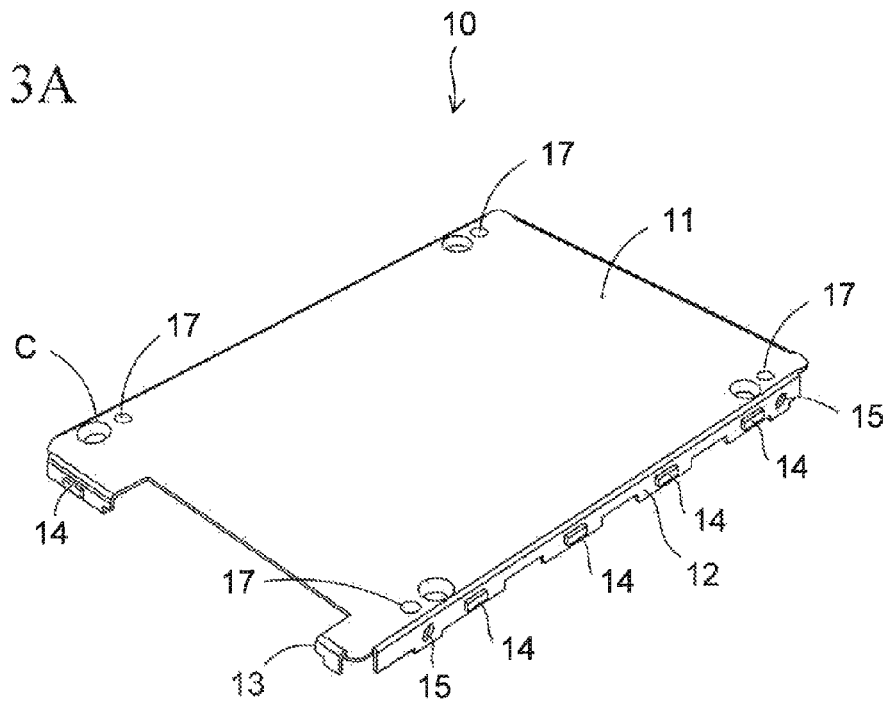
FIGS. 3A and 3B are perspective views depicting a lower case of a first electronic component case of an embodiment.
Figure 3B:
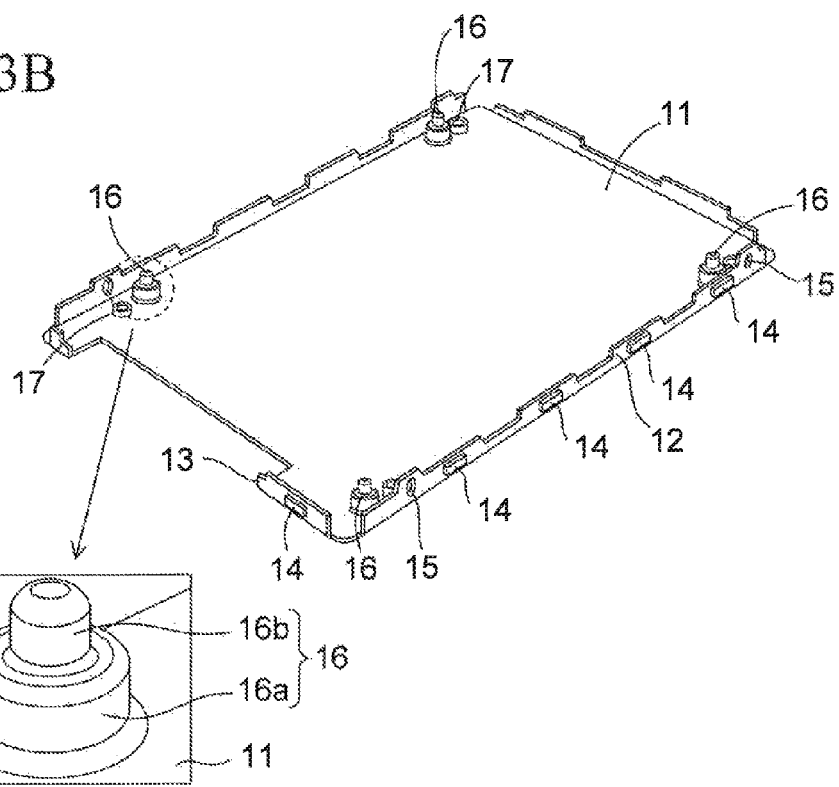

FIGS. 3A and 3B are perspective views depicting a lower case of a first electronic component case of an embodiment.

Figure 4A:
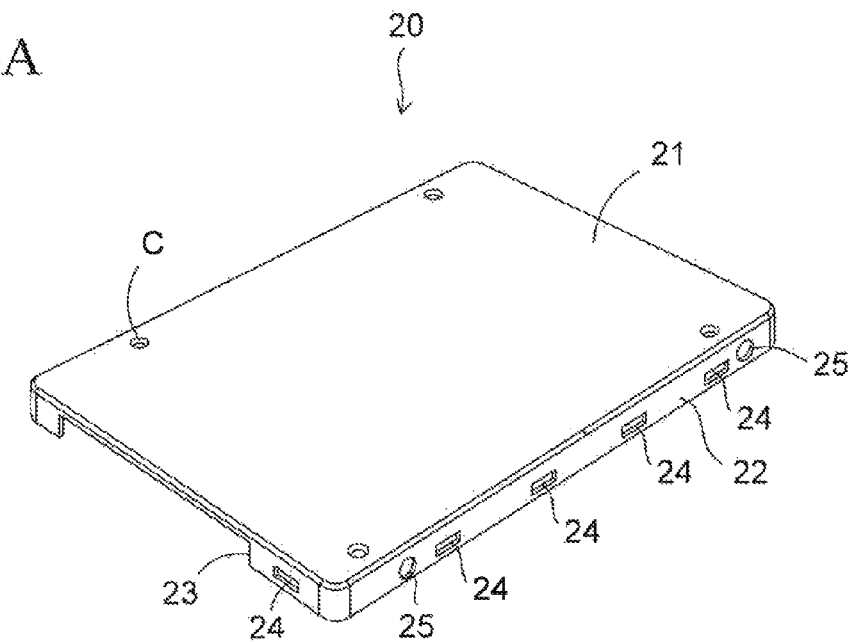
FIGS. 4A and 4B are perspective views depicting an upper case of the first electronic, component case of the embodiment.
Figure 4B:
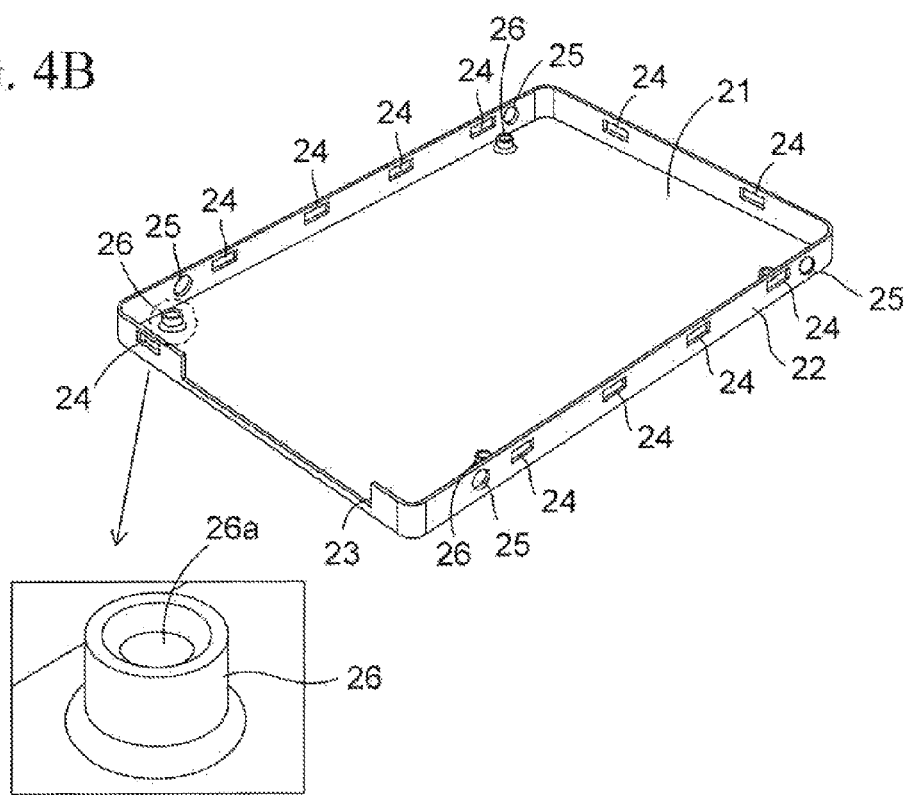

FIGS. 4A and 4B are perspective views depicting an upper case of the first electronic component case of the embodiment.

FIG. 3A depicts the front side of a lower case 10, FIG. 33 depicts the back side of the lower case 10. As depicted in FIGS. 3A and 3B, the lower case 10 includes a rectangular bottom plate 11 and a side wall 12 arranged along the outer periphery thereof.

The side wall 12 is not formed in a center part of one of the opposite short sides among the four sides of the bottom plate 11, and a connector opening portion 13 for exposing a connector of an electronic component is formed there.

Moreover, engaging projections 14 of 11 pieces are formed on the outer face of the side wall 12 of the lower case 10 such that the engaging projections 14 protrude outward to space at a certain interval.

Moreover, side-face screw holes 15 for screwing the lower case 10 to a housing of electronic equipment or the like are formed in both end sides of the side wall 12 of the opposite long sides among the four sides of the lower case 10. Four side-face screw holes 15 are arranged in total, and two side-face screw holes 15 are arranged in each of the opposite side walls 12.

Moreover, a bottom-plate screw hole 17 is formed in the bottom plate 11 located in the vicinity part of each of the four side-face screw holes 15 of the lower case 10. The screw cutting process is applied in the side-face screw holes 15 and the bottom-plate screw holes 17 of the lower case 10, and either of them is screwed to the housing of the electronic equipment or the like.

Referring to the back side of the lower case 10 to add the partial perspective view in FIG. 3B, a substrate positioning projection 16 is arranged at each of the four corners of the periphery in the face of the bottom plate 11 located to the side wall 12 side respectively. The substrate positioning projection 16 is formed of a large diameter portion 16a located to the lower side and a small diameter portion 16b located to the upper side, and the upper periphery of each of the large diameter portion 16a and the small diameter portion 16b is chamfered.

As will be described later, the substrate positioning projections 16 of the lower case 10 is inserted to datum holes in the substrate of the electronic component, thereby the substrate of the electronic component is arranged to be positioned on the lower case 10.

The lower case 10 is formed by shaping an aluminum-based metal plate like a thin plate by means of the stamping. In the stamping, the metal plate is shaped by bending process and drawing process. For this reason, the plate thickness is set in the same thickness over the whole.

Each substrate positioning projection 16 of the lower case 10 is formed by the drawing process. Therefore, the back side of the substrate positioning projection 16 is formed as a concave portion and thus formed as a cavity hole C (FIG. 3A). For this reason, unlike the die casting method, although the substrate positioning projections 16 are arranged, since the back side of the substrate positioning projection 16 is formed as the cavity hole C, the part that the thickness is thick is never termed.

As described above, the lower case 10 is formed by shaping the metal plate by means of the stamping including the bending process and the drawing process. Therefore the lower case 10 is formed with the same thickness in a connected state over the whole. Accordingly, the weight saving can be attained as compared with the die casting method.

Moreover, in the stamping, the materials are not limited to those exclusive metals for use in the die casting method. It can use aluminum materials which do not contain the binder and the impurities as much as possible, such as pure aluminum, and aluminum (Al)-magnesium (Mg) alloys having excellent thermal conductivity.

In pure aluminum, the content rate of Si is 0.25% and the content rate of Cu is 0.05%, and thus the content rate of the impurities is suppressed considerably low. Moreover, in aluminum (Al)-magnesium (Mg) alloys, Mg is contained with the rate by 2.2 to 2.8%, Si is contained with the rate by 0.25%, and Cu is contained with the rate by 0.1%.

As described above, aluminum materials used in the stamping have lower content rates of impurities than those of aluminum materials used in. the die casting method as described above, therefore have, high thermal conductivity. Moreover, pure aluminum has lower content rates of impurities than those of aluminum-magnesium alloys, therefore has higher thermal conductivity.

For this reason, in the case that the electronic component case needs high heat radiation performance, it can easily respond by using the stamping.

Moreover, in the stamping, a metal plate in which the surface finish is already completed is processed. Therefore, it is not necessary to perform the surface finish by polishing, which is done in the die casting method, thus the man hour can be reduced.

Moreover, the dies used in the stamping have a life several times or more longer than the dies used in the die casting method. Thus, the running cost can be reduced.

Moreover, the stamping has higher dimensional accuracy as compared with the die casting method, and thus can be applied to the products in which the high accuracy is required.

Next, the upper case of the first electronic component case of this embodiment will be explained. FIG. 4A depicts the front side of an upper case 20, FIG. 4B depicts the back side of the upper case 20.

As depicted in FIGS. 4A and 4B, the upper case 20 of the first electronic component case of the embodiment includes a rectangular top plate 21 and a side wall 22 arranged along the outer periphery thereof. The side wall 22 is not formed in a center part of one of the opposite short sides among the four sides of the top plate 21, and a connector opening portion 23 for exposing the connector of the electronic component is formed there. The connector opening portion 23 of the upper case 20 is arranged to correspond to at a position of the connector opening portion 13 of the lower case 10.

Moreover, engaging holes 24 in which the engaging projections 14 of the lower case 10 are engaged are arranged side by side in the side wall 22 of the upper case 20. The engaging holes 24 of the upper case 20 are arranged at positions corresponding to the engaging projections 14 of 11 pieces of the lower case 10 respectively.

Moreover, side-face screwing opening portions 25 are arranged in both end sides of the side wall 22 of the opposite long sides among the four sides of the upper case 20. The side-face screwing opening portions 25 of the upper case 20 are arranged at positions corresponding to the four side-face screw holes 15 of the lower case 10.

When the upper case 20 is arranged, on the lower case 10, the side-face screwing opening portions 25 of the upper case 20 overlap the outside of the side-face screw holes 15 of the lower case 10.

As depicted in FIG. 4B, referring to the back side of the upper case 20, a substrate pushing projection 26 is arranged at each of the four corners of the periphery in the face of the top plate 21 located to the side wall 22 side respectively. The substrate pushing projections 26 of the upper case 20 are arranged at positions corresponding to the four substrate positioning projections 16 of the lower case 10.

Referring to the partially enlarged perspective view in FIG. 4B, in each substrate pushing projection 26, a concave portion 26a is formed from a center part of the tip to an inner part. As will be described later, the substrate of the electronic component which is arranged to be positioned on the lower case 10 is pushed and fixed by the substrate pushing projection 26 of the upper case 20.

Like the lower case 10 described above, the upper case 20 is formed by shaping a metal plate like the thin plate by means of the stamping. Accordingly, each substrate pushing projection 26 of the upper case 20 is likewise formed by the drawing process. Therefore, the back side of the substrate pushing projection 26 is formed as the concave portion and thus formed as a cavity hole C (FIG. 4A).

Moreover, like the lower case 10 described above, the upper case 20 is likewise formed with the same thickness in a connected state over the whole.

When the upper case 20 is formed by the stamping as well, it has advantages similar to the manufacture of the lower case 10 described above, as compared with the die casting method.

The first electronic component case is formed by arranging the upper case 20 in FIG. 4A on the lower case 10 in FIG. 3B and engaging the engaging projections 14 of the lower case 10 to the engaging holes 24 of the upper case 20.

Next, an electronic component device using the first electronic component case of this embodiment will be explained. This embodiment will be explained to enumerate a case in which the first electronic component case is used as a case for SSD (Solid State Drive) which is an example of a memory element. The SSD has a flash memory used as a memory medium and is utilized as a main memory device of a personal computer or the like.

Figure 5:
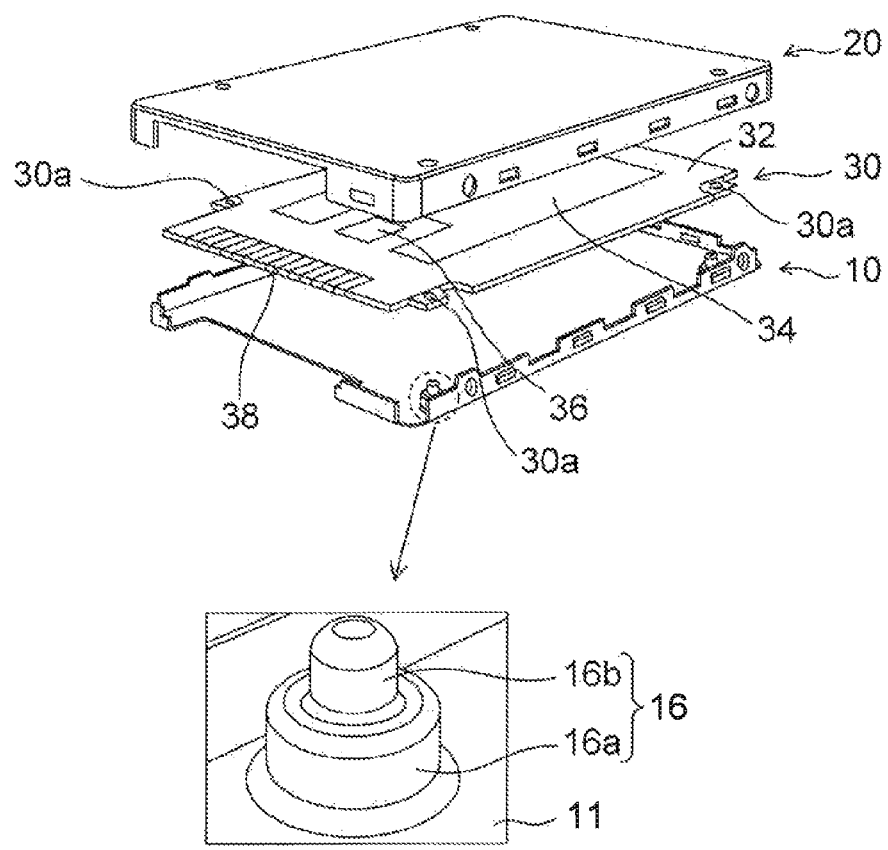
FIG. 5 is a perspective view depicting a state that an SSD substrate and the upper case are arranged on the lower case in the embodiment.

As depicted in FIG. 5, in an SSD substrate 30 which is to be housed in the first electronic component case, a flash memory module 34, a controller chip 36, or the like are mounted on a wiring substrate 32. A connector portion 38 is provided in a center part of one side of the SSD substrate 30. A datum hole 30a penetrating in the thickness direction is formed at each of the four corners of the SSD substrate 30.

Then, the lower case 10 in FIGS. 3A and 3B and the upper case 20 in FIGS. 4A and 4B described above are prepared. A thermal conduction sheet having elasticity (not depicted) is formed on the inner face of the lower case 10. A similar thermal conduction sheet (not depicted) is also formed on the inner face of the upper case 20.

Figure 6A:
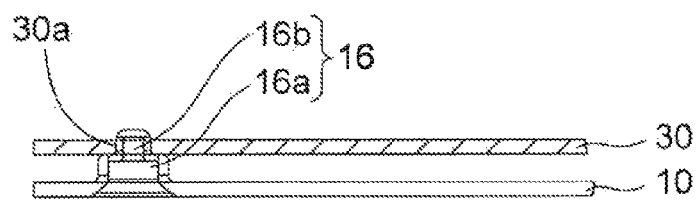
FIGS. 6A and 6B are cross-sectional views depicting a state that the SSD substrate is sandwiched between and fixed by substrate positioning projections of the lower case and substrate pushing projections of the upper case.

Thereafter, the SSD substrate 30 is arranged on the lower case 10. Referring to FIG. 6A additionally, the small diameter portions 16b (partially enlarged perspective view in FIG. 5) of the substrate positioning projections 16 of the lower case 10 are inserted into the datum holes 30a of the SSD substrate 30.

At this time, the SSD substrate 30 is arranged to contact the periphery of the upper face of the large diameter portion 16a of each substrate positioning projection 16 of the lower case 10. By this matter, the SSD substrate 30 is arranged on the lower case 10 in a state that the SSD substrate 30 is positioned in the X-Y direction (horizontal direction).

Figure 7:
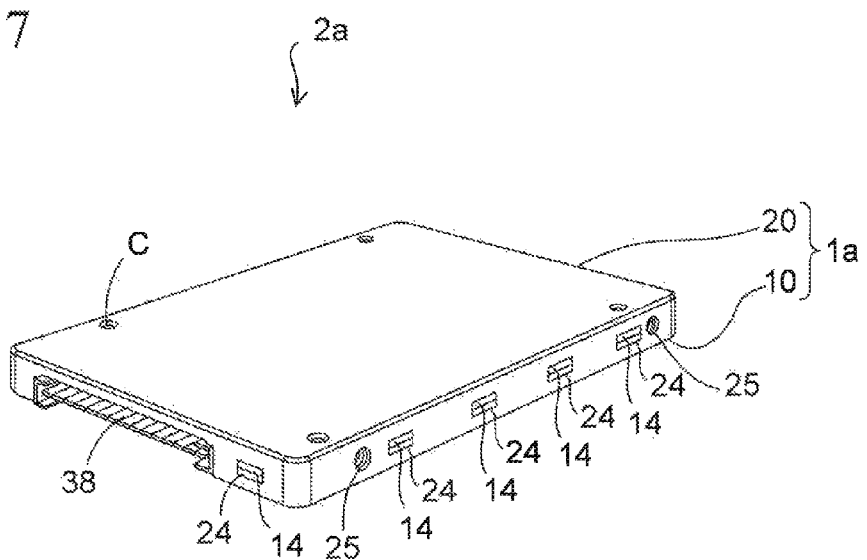
FIG. 7 is a perspective view depicting a first electronic component device of the embodiment.

Then, as depicted in FIG. 7, the upper case 20 is arranged on the lower case 10 on which the SSD substrate 30 is arranged, and the upper case 20 is pushed downward to thereby engage the engaging projections 14 of the lower case 10 to upper parts of the engaging holes 24 of the upper case 20 and to fix the upper case 20.

Figure 6B:
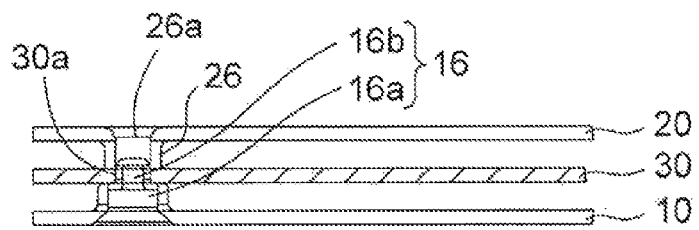

At this time, referring to FIG. 6B additionally the substrate pushing projections 26 of the upper case 20 push the SSD substrate 30 in the periphery of the datum holes 30a. Also, at the same time, tip parts of the small diameter portions 16b of the substrate positioning projections 16 of the lower case 10 are housed in the concave portions 26a of the substrate pushing projections 26 of the upper case 20.

By this matter, it is in a state that the SSD substrate 30 is sandwiched between the substrate positioning projections 16 of the lower case 10 and the substrate pushing projections 26 of the upper case 20 and is fixed by them. Consequently, it can be prevented that moving of the SSD substrate 30 not only to the X-Y direction (horizontal direction) but also to the Z direction (height direction).

The SSD substrate 30 is arranged at the height level of the upper face edge parts of the large diameter portions 16a of the substrate positioning projections 16 of the lower case 10. The substrate positioning projections 16 of the lower case 10 are inserted in the datum holes 30a of the SSD substrate 30, and the small diameter portions 16b of the substrate positioning projections 16 are arranged in the concave portions 26a of the substrate pushing projections 26 of the upper case 20. By this matter, a structure in which the SSD substrate 30 is hard to be detached from the lower case 10 can be constituted.

As a result, as depicted in FIG. 7, a first electronic component device 2a of this embodiment is obtained. The first electronic component device 2a includes the first electronic component case 1a formed of the lower case 10 and the upper case 20, and the SSD substrate 30 housed therein.

In this way, according to this embodiment, the SSD substrate 30 can be fixed without using the screwing by sandwiching the SSD substrate 30 between the substrate positioning projections 16 of the lower case 10 and the substrate pushing projections 26 of the upper case 20.

By this matter, as compared with the methods using the screwing, many components are not needed, and the assembly can be easily performed by a single simple action. Accordingly, the complicated works are eliminated, and the assembly time can be reduced, thus the production efficiency can be improved.

Next, a second electronic, component device of this embodiment will be explained. In the second electronic component device, even when it is the case that the whole thickness becomes thin, it is devised such that the side-face screw holes can be arranged and exposed in the side wall of the lower case.

The explanation will be provided below to enumerate a specific example of the dimensions of the electronic component device in order to facilitate understanding. First, when the side-face screw holes 15 with a diameter of about 3.5 mm (M3 tap) are to be formed in the side wall 12 of the lower case 10, the height of the side wall 12 from the inner face of the bottom plate 11 needs to be at least about 4.5 mm.

The height of the side wall 22 of the upper case 20 of the first electronic component device 2a in FIG. 7 described, above is 5.8 mm from the inner face of the top plate 21. Moreover, the height of the side wall 12 of the lower case 10 of the first electronic component device 2a described above is also 5.8 mm from the inner face of the bottom plate 11. The plate thickness of each of the upper case 20 and the lower case 10 is 0.6 mm.

Then, when the upper case 20 is arranged on and engaged to the lower case 10, the whole thickness of the first electronic component device 2a is 7 mm (height (5.8 mm)+plate thickness (0.6 mm)×2).

Here, in the case of thinning the whole thickness of the first electronic component device 2a to 5 mm, it is difficult to achieve even if the height of the side wall 22 of the upper case 20 is lowered.

Figure 8A:
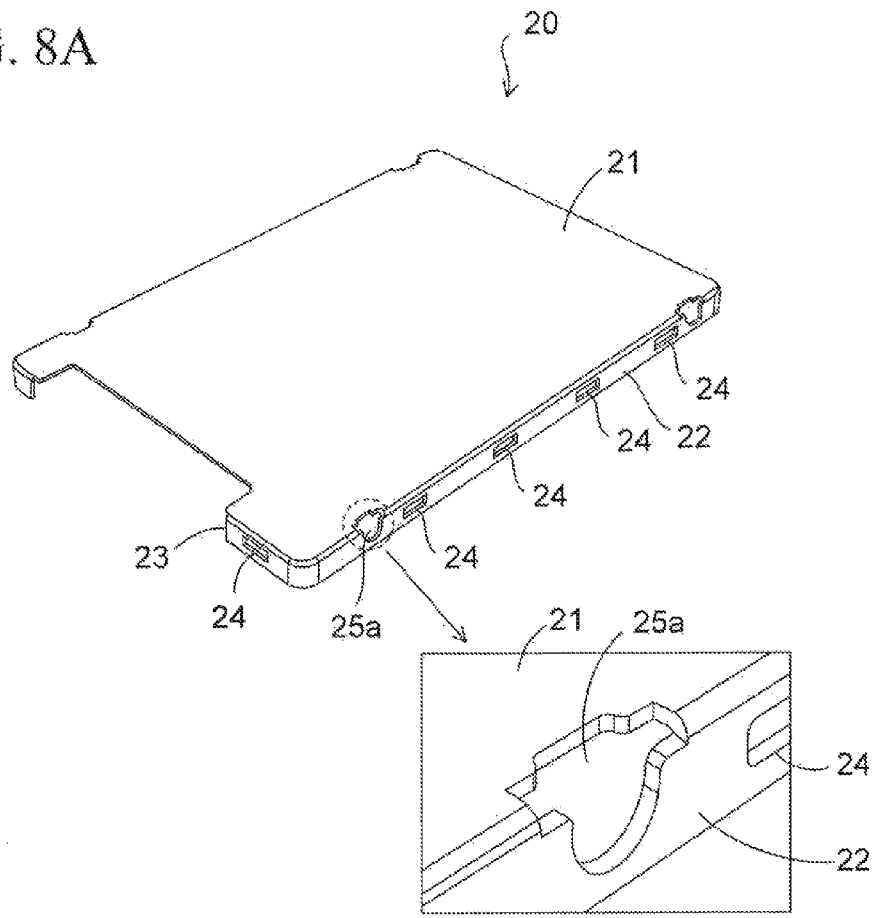
FIGS. 8A and 8B are a perspective view and a front view depicting the front side of an upper case of a second electronic component case of the embodiment.

Thus, as depicted in FIG. 8A, in the vicinity region of each side-face screwing opening portion 25 of the upper case 20 in FIG. 4A described above, a notched hole 25a is formed in a region extending from a halfway position in the height of the side wall 22 to the periphery of the top plate 21. The notched hole 25a is formed to penetrate the side wall 22 and the top plate 21.

Note that, in the example of FIG. 8A, the substrate pushing projections 26 of the upper case 20 in FIG. 4B described above are omitted and the cavity holes C are not provided at the front side in order to thin the thickness. However, the substrate pushing projections 26 may be formed similarly to FIG. 4B.

Figure 8B:
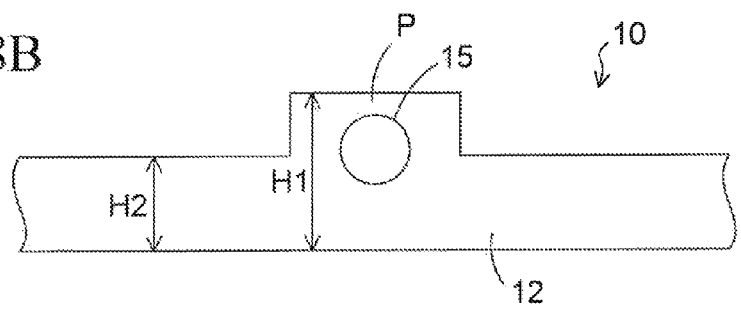

Then, as depicted in FIG. 8B, in the lower case 10, a height H1 of the side wall 12 in the regions where the side-face screw holes 15 are arranged is 4.5 mm, and the region is formed as protruding portions P, and a height. H2 of the side wall 12 in the other regions is 3.4 mm. The heights H1, H2 of the side wall 12 are heights from the inner face of the bottom plate 11.

In this way, the side wall 12 is formed, which has the protruding portions P protruding upward and whose height is higher than the other regions, and the side-face screw holes 15 are arranged in the side wall 12 in the regions where the protruding portions P are provided.

By this matter, in the lower case 10, the height H1 of the side wall 12 in the regions where the side-face screw holes 15 are arranged, is 4.5 mm and is set high locally. Therefore, the side-face screw holes 15 with a diameter of about 3.5 mm can be formed in the side wall 12 in the regions of the protruding portions P.

Figure 9:
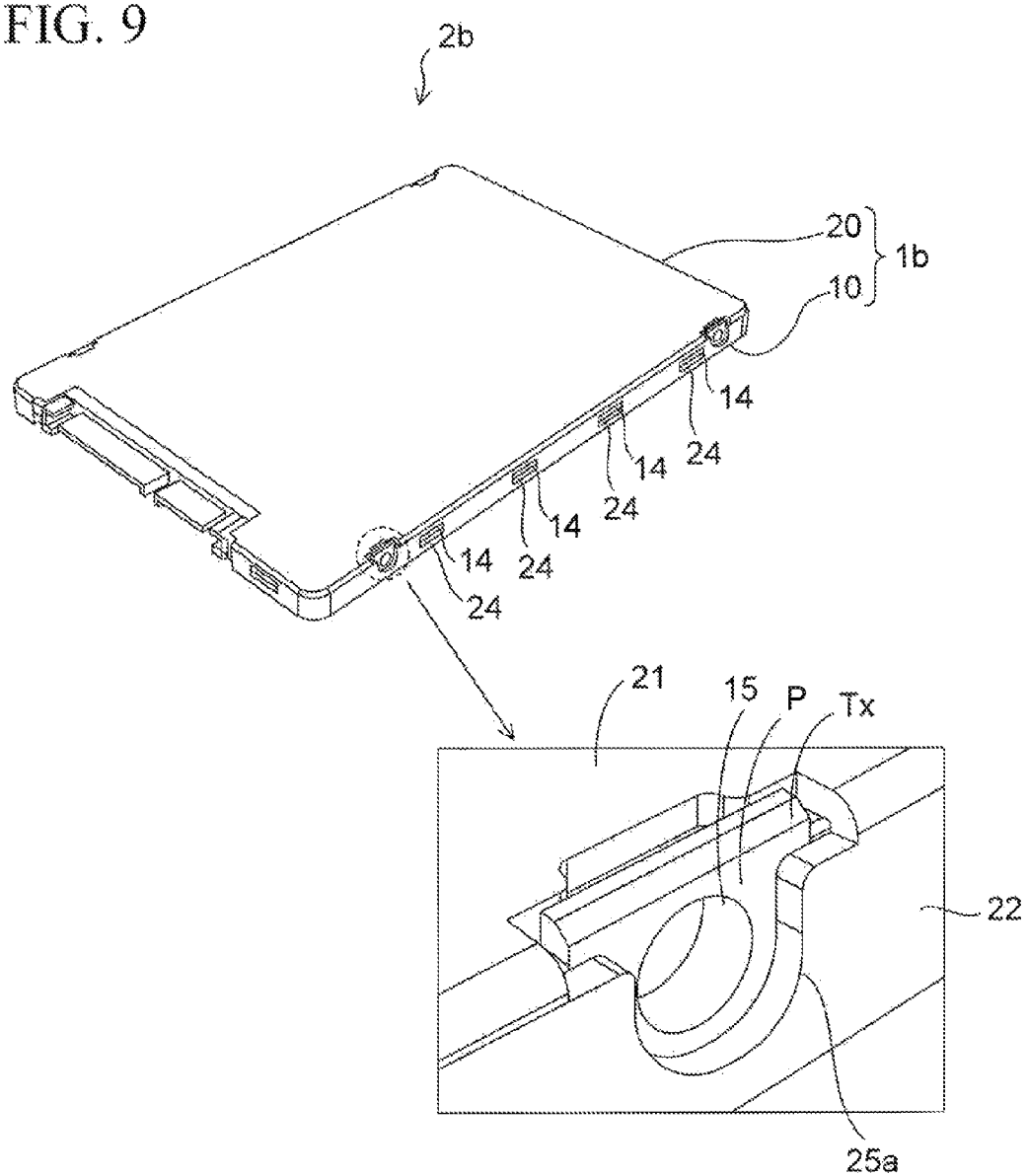
FIG. 9 is a perspective view depicting a second electronic component device of the embodiment.

Then, as depicted in FIG. 9, the upper case 20 in FIG. 8A is arranged on and engaged to the lower case 10 having the side wall 12 provided with the protruding portions P in FIG. 8B.

At this time, as depicted in the partially enlarged perspective view in FIG. 9, the structure is constituted in which the protruding portions P of the side wall 12 of the lower case 10 are arranged in upper parts of the notched holes 25a of the upper case 20, and do not interfere in the upper case 20. The distance between the inner face of the lower case 10 and the inner face of the upper case 20 is 3.8 mm. Then, it is in a state that the side-face screw holes 15 of the lower case 10 are exposed in the notched holes 25a of the upper case 20.

By this matter, a second, electronic component, device 2b is obtained, The second electronic component device 2b includes a second electronic component case 1b formed of the lower case 10 and the upper case 20, and the SSD substrate 30.

Note that, the lower case 10 of the second electronic component device 2b provided with the protruding portions P may be used to constitute an electronic component device having a whole thickness of about 7 mm like the first electronic component device 2a. In this case, the distance between the inner face of the lower case 10 and the inner face of the upper case 20 is set to 5.8 mm. In this structure, the height of the side wall 22 of the lower case 20 is sufficiently high. Therefore, the protruding portions P of the lower case 10 do not interfere in the upper case 20 even when the notched holes 25a are not provided in the upper case 20.

As described above, in the second electronic component device 2b, only the regions of the side wall 12 of the lower case 10 where the side-face screw holes 15 are formed are formed as the protruding portions P having such a height (4.5 mm) that the side-face screw holes 15 can be formed therein.

When the upper case 20 is arranged on and engaged to the lower case 10, such a structure is employed that the protruding portions P of the side wall 12 of the lower case 10 are arranged in the notched holes 25a of the upper case 20, and do not interfere in the top plate 21 of the upper case 20.

As described above, the excess height of the protruding portions P of the side wall 12 of the lower case 10 is absorbed by the notched holes 25a of the upper case 20. Thereby, the side-face screw holes 15 can be disposed in narrow side-wall regions.

Figure 10:
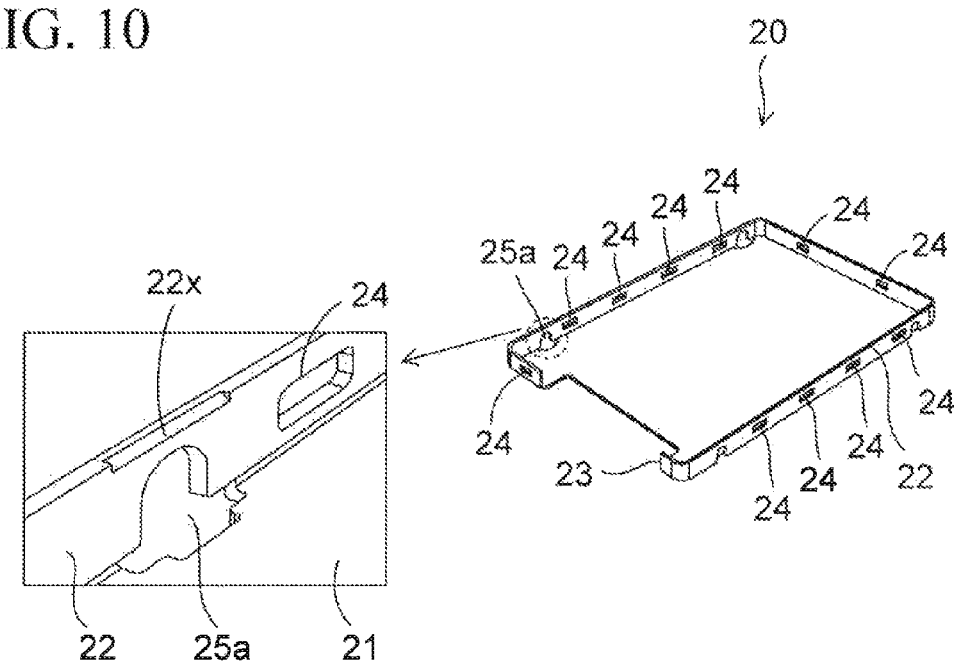
FIG. 10 is a perspective view depicting the back side of the upper case of the second electronic component device of the embodiment.

Moreover, as depicted in the partially enlarged perspective view in FIG. 9, the outer edge of each protruding portion P of the side wall 12 of the lower case 10 is formed as a chamfered portion Tx. FIG. 10 is a perspective view depicting the back side of the upper case 20 in FIG. 8A.

As depicted in the partially enlarged perspective view in FIG. 10, the inner edge of the side wall 22 of the upper case 20 in each of the regions where the notched holes 25a are arranged is formed as a chamfered portion 22x. The parts of the side wall 22 of the upper case 20 where the chamfered portions 22x are formed correspond to the protruding portions P of the side wall 12 of the lower case 10.

By this matter, when the upper case 20 is engaged to the lower case 10, even if the chamfered portions 22x of the side wall 22 of the upper case 20 contact the chamfered portions Tx of the protruding portions P of the side wall 12 of the lower case 10, the assembly can be performed smoothly without being caught.

Moreover, in the first and second electronic component cases 1a, 1b of this embodiment, the engaging projections 14 of the lower case 10 are engaged to the engaging holes 24 of the upper case 20 and are fixed.

For this reason, even when the electronic component device is dropped or receives impact from the outside, the upper case 20 and the lower case 10 are hard to be detached from each other. Accordingly, the upper case 20 and the lower case 10 can be fixed reliably and firmly.

In the first and second electronic component devices 2a, 2b of this embodiment, it is also possible to detach the lower case 10 from the upper case 20 by using a detachment jig, as the need arises.

Figure 11:
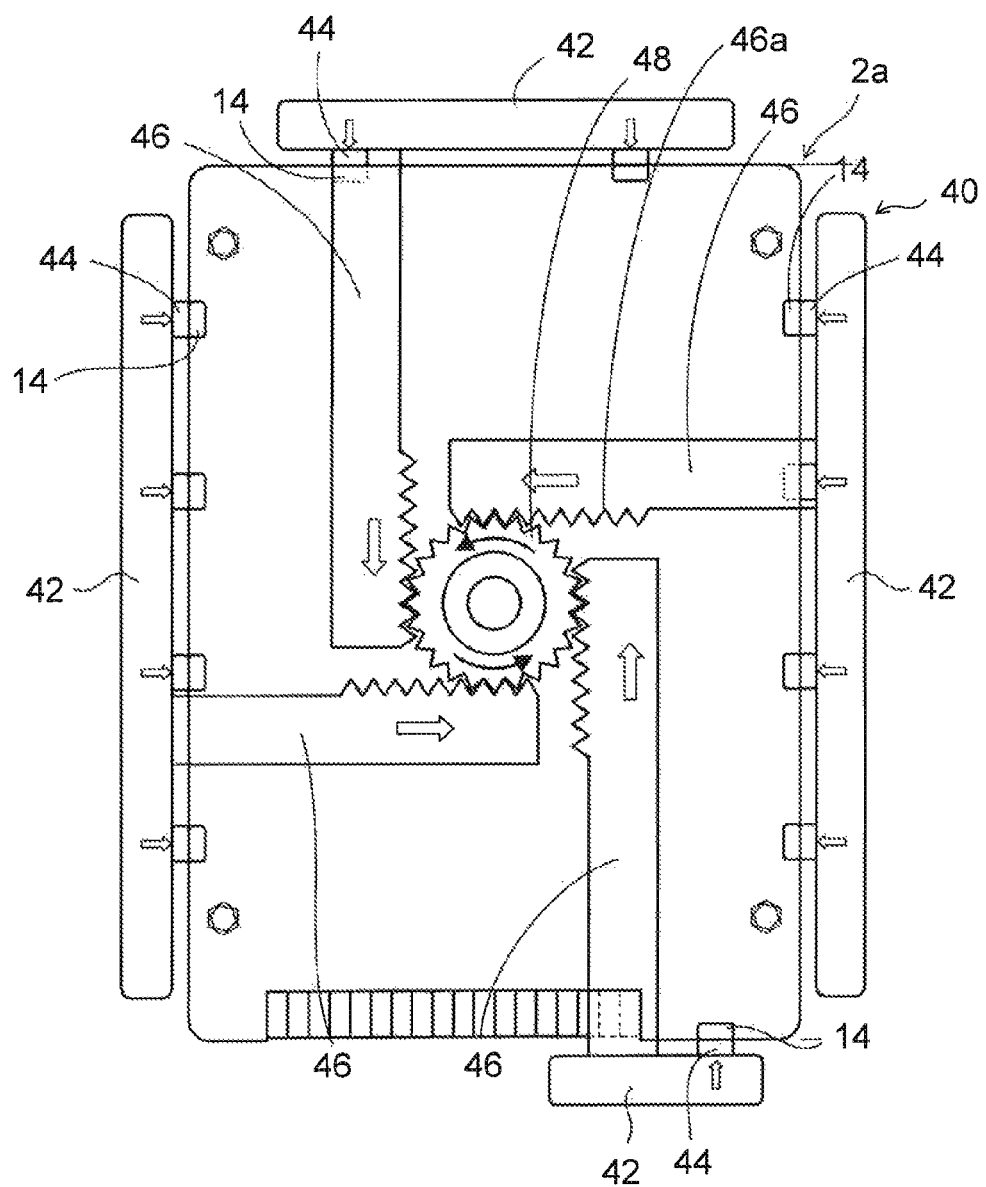
FIG. 11 is a plan view schematically depicting a state that a detachment jig is arranged on the first electronic component device of the embodiment.

FIG. 11 is a plan view schematically depicting a state that a detachment jig is arranged on the first electronic component device 2a of this embodiment. As depicted in FIG. 11, as in FIG. 7 described above, the engaging projections 14 of the lower case 10 engaged to the engaging holes 24 of the upper case 20 are exposed in the side wall of the first electronic component device 2a Then, when the lower case 10 is to be detached from the upper case 20, a detachment jig 40 is arranged in the periphery of the first electronic component case 1a. The detachment jig 40 includes four pressing members 42 arranged in the periphery of the first electronic component device 2a. Each pressing member 42 includes pressing pins 44 at positions corresponding to the plurality of engaging projections 14 of the lower case 10.

Also, coupled members 46 extending inward are coupled to the four pressing members 42. A linear gear 46a (rack gear) is provided on one side face of each coupled member 46.

Moreover, the detachment jig 40 includes a wheel gear 48 in the center upper region of the first electronic component device 2a, and the linear gear 46a of each coupled member 46 gears to the wheel gear 48.

When the wheel gear 48 is rotated by a driving means such as a motor, each coupled member 46 is moved inward in conjunction with it, and the pressing pins 44 of the pressing member 42 coupled to the coupled member 46 are moved inward as well. By this matter, the plurality of engaging projections 14 of the lower case 10 are simultaneously pressed inward by the pressing pins 44 of the pressing members 42 and disengaged from the engaging holes 24 of the upper case 20.

By this matter, the lower case 10 can be separated and detached from the upper case 20.

In this way, by using the exclusive detachment jig 40 as described above, reworking can be performed as the need arises.

In the embodiment described above, as the electronic component to be housed in the first and second electronic component cases 1a, 1b, the SSD substrate 30 which is a memory element is illustrated. However, the electronic component cases can be used as a case for various types of electronic components.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic component case, comprising:
a lower case including
a bottom plate,
a side wall having a protruding portion,
an engaging projection formed on an outer face of the side wall, and
a screw hole formed in the side wall in a region where the protruding portion is provided; and
an upper case including
a top plate,
a side wall in which an engaging hole is formed, and
a notched hole formed in the side wall of the top plate side, wherein
the protruding portion of the lower case is engaged to the notched hole of the upper case, and the screw hole is exposed in the notched hole, and
the engaging projection of the lower case is engaged to the engaging hole of the upper case.

2. The electronic component case according to claim 1, wherein
an outer edge part of the protruding portion of the side wall of the lower case is chamfered, and
an inner edge part of the side wall of the upper case in a region where the notched hole is provided is chamfered.

3. The electronic component case according to claim 1, wherein the upper case and the lower case are formed of any one of pure aluminum and an aluminum-magnesium alloy.

4. An electronic component device, comprising:
a lower case including
a bottom plate,
a side wall having a protruding portion,
an engaging projection formed on an outer face of the side wall, and
a screw hole formed in the side wall in a region where the protruding portion is provided;
an upper case including
a top plate,
a side wall in which an engaging hole is formed, and
a notched hole formed in the side wall on the top plate side; and
an electronic component housed between the lower case and the upper case, wherein the protruding portion of the lower case is engaged to the notched hole of the upper case, and the screw hole is exposed in the notched hole, and the engaging projection of the lower case is engaged to the engaging hole of the upper case.

5. The electronic component device according to claim 4, wherein the electronic component is a memory element.

\* \* \* \* \*